United States Patent
Hutton et al.

[19]

[11] Patent Number: 6,054,869
[45] Date of Patent: Apr. 25, 2000

[54] BI-LEVEL TEST FIXTURE FOR TESTING PRINTED CIRCUIT BOARDS

[75] Inventors: Gordon R. Hutton, Barrington; Gerald Greene, Cranston, both of R.I.

[73] Assignee: H+W Test Products, Inc., Seekonk, Mass.

[21] Appl. No.: 09/044,662

[22] Filed: Mar. 19, 1998

[51] Int. Cl.⁷ ............................ G01R 1/073; G01R 31/02
[52] U.S. Cl. .................... 324/754; 324/761; 324/158.1
[58] Field of Search ...................................... 324/537, 754, 324/757, 761, 158.1

[56] References Cited

U.S. PATENT DOCUMENTS

| | | | |
|---|---|---|---|
| 3,757,219 | 9/1973 | Aksu | 324/758 |
| 4,017,793 | 4/1977 | Haines | 324/763 |
| 4,115,735 | 9/1978 | Stanford | 324/754 |
| 4,625,164 | 11/1986 | Golder et al. | 324/763 |
| 4,636,723 | 1/1987 | Coffin | 324/761 |
| 4,667,155 | 5/1987 | Coiner et al. | 324/754 |
| 4,884,024 | 11/1989 | DiPerna | 324/761 |
| 5,214,374 | 5/1993 | St. Onge | 324/754 |
| 5,422,575 | 6/1995 | Ferrer et al. | 324/754 |
| 5,436,567 | 7/1995 | Wexler et al. | 324/754 |
| 5,489,853 | 2/1996 | Nakajima | 324/754 |
| 5,500,606 | 3/1996 | Holmes | 324/761 |
| 5,534,787 | 7/1996 | Levy | 324/761 |
| 5,557,211 | 9/1996 | Ferrer et al. | 324/754 |
| 5,894,225 | 4/1999 | Coffin | 324/762 |

*Primary Examiner*—Glenn W. Brown
*Attorney, Agent, or Firm*—Barlow, Josephs & Holmes, Ltd.

[57] ABSTRACT

A bi-level test fixture for testing printed circuit boards is provided. A series of guide pins emanate downwardly from the diaphragm board through corresponding guide pin apertures present through the probe plate. Upon application of a full vacuum to the test fixture, the diaphragm board is drawn completely toward the probe plate thus extending the guide pins through their corresponding guide pin apertures. The portion of the guide pins below the probe plate engage with a pneumatically actuated fork member. Upon release of the vacuum to the test fixture, the upward travel of the diaphragm board is limited and at a distance so that only functional test probes are in contact with the unit under test. Application of a full vacuum again enables disengagement of the fork member with the guide pin to allow the diaphragm board to travel fully upward to its resting position for removal of the unit under test. In-circuit testing may be conducted at either or both times when a full vacuum is applied to the test fixture resulting in both the functional test probes and in-circuit test probes contacting the unit under test. A transition from functional testing to in-circuit testing, or vice versa, is accomplished without disengaging the functional test probes from the unit under test.

10 Claims, 6 Drawing Sheets

BI-LEVEL TEST FIXTURE FOR TESTING PRINTED CIRCUIT BOARDS

BACKGROUND OF THE INVENTION

The present invention relates generally to a test fixture for printed circuit boards. More specifically, the present invention relates to a bi-level test fixture for conducting automatic functional and in-circuit testing of printed circuit boards.

In the field of automatic testing equipment (ATE), it has been well known to employ a vacuum actuated test fixture for receiving an electronic circuit device or unit under test (UUT) to be tested and then electrically interconnecting the UUT to the automatic testing equipment. In the prior art, it has become well known for the automatic testing equipment to include a plate, commonly referred to as a probe plate, for carrying an array of test probes. Also, a board is provided for carrying the electronic circuit device or UUT to be tested, commonly referred to a diaphragm board. The diaphragm board is typically positioned above and in spring-biased relation to the probe plate. As a result, a chamber is formed between the probe plate and the diaphragm board. To actuate the diaphragm board into contact with the test probes present on the probe plate for testing, air in the chamber is evacuated to create a vacuum therein. As a result, the diaphragm board is drawn toward the probe plate for testing of the electronic circuit device. The vacuum is maintained by a seal system present between the diaphragm board, probe plate and the electronic circuit board to be tested.

Typically, test fixtures for testing printed circuit boards, operate to provide both in-circuit and functional testing. For in-circuit testing, the testing equipment is used to determine the integrity of the individual components installed on the UUT, such as determining integrity of trace paths and values of individual components. For functional testing, the cooperation of the individual components installed in the UUT is tested to determine whether the intended device function is being carried out In the prior art, it has been known to employ completely separate test fixtures for testing the UUT. However, the requirement of a separate testing unit and the significant additional labor costs make this approach cost prohibitive.

Many attempts have been made in the prior art to address the need for conducting both an in-circuit and functional test of a UUT or electronic circuit device. Test fixtures, having a first and second platen which are movable by first and second vacuum chamber actuators into contact with the electronic circuit device or UUT to selectively provide either in-circuit or functional testing, has been disclosed in the prior art.

For example, U.S. Pat. No. 4,115,735, issued to Stanford, discloses a number of probes slideably mounted in a corresponding guide that are in electrical communication by individual ones of a number of wires to the automatic testing equipment. Due to the possible leakage and vacuum loss between the first and second vacuum chamber actuators, this device is not reliable and is expensive to operate and maintain.

In addition, attempts have been made in the prior art to employ a single platen or diaphragm board which is controlled by a complex vacuum controller. In these attempts, an expensive and complex vacuum controller and system are employed to enable two different levels of vacuum to be introduced between the diaphragm board and the probe plate. The use of springs of different compression characteristics are typically employed to control the downward travel of a diaphragm board toward the probe plate when a particular vacuum level is applied. The use of additional spring members and complex vacuum controllers to deliver multiple levels of vacuum significantly increase the overall cost of the test fixture and the maintenance thereof.

Still further, attempts have been made in the prior art to use a single level vacuum source without complicated spring and platen arrangements. For example, U.S. Pat. No. 4,636,723, issued to Coffin, discloses a testing device for printed circuit boards which employs an interim spacer stop plate with protrusions thereon to stop the further downward travel of the diaphragm board to permit only the desired probes to contact the UUT for the appropriate desired test. For functional testing, the stop plate is slid horizontally into position to limit the downward travel of the diaphragm board so that only the higher functional test probes can contact the UUT. Functional testing occurs with full vacuum applied and the stop plate in its first, higher position. For in-circuit testing, the vacuum of the Coffin device must be completely released so that the stop plate may be slid into its second, lower position. A full vacuum is then applied again which draws the diaphragm board closer to the probe plate than the prior functional test so that both the functional and in-circuit test probes contact the UUT. In the Coffin '723 patent, the vacuum must be completely released to slide the stop plate which results in the functional test probes temporarily breaking contact with the UUT. Further, both functional and in-circuit testing can only occur when a full vacuum is being applied. However, the Coffin patent suffers the disadvantages of requiring that a vacuum must be present for both functional and in-circuit testing and that the functional test probes must be disengaged to switch testing modes.

Due to the demand for a test fixture which can be inexpensive to assemble, operate and maintain while still being able to provide quality functional and in-circuit testing, it is desirable for a test fixture to include a single level vacuum source and a quick and easy configuration for quickly switching between functional testing and in-circuit testing and vice versa without sacrificing the integrity of the testing cycle. It is also desirable that the test fixture employ standard parts and components and use standard vacuum sources available in most printed circuit board testing facilities.

SUMMARY OF THE INVENTION

The present invention preserves the advantages of prior art automatic bi-level testing equipment test fixtures for printed circuit boards. In addition, it provides new advantages not found in currently available bi-level test fixtures, and overcomes many disadvantages of such currently available test fixtures.

The invention is generally directed to a novel and unique automatic bi-level testing equipment test fixture with particular application in testing printed circuit boards. The test fixture of the present invention enables the simple, easy and inexpensive assembly, use and maintenance of an automatic test fixture while providing both functional and in-circuit testing.

The preferred embodiment of the present invention includes a probe plate, having an upper surface, defining functional test probe apertures and in-circuit test probe apertures. The probe plate also includes guide pin apertures therethrough. Function test probes reside in the functional test probe apertures and extend upwardly from the upper surface of the probe plate a first distance and the in-circuit test probes reside in the in-circuit test probe apertures and extend upwardly from the upper surface of the probe plate a second distance. The functional test probes extend above the upper surface of the probe plate a distance greater than the in-circuit test probes. A diaphragm board, having a lower surface, is positioned above the probe plate to define an air chamber therebetween. A seal is positioned between the probe plate and diaphragm board for maintaining a vacuum between the probe plate and diaphragm board upon removal of air present in the air chamber. The diaphragm board is moveable relative to the probe plate.

Guide pins are connected to and emanate downwardly from the diaphragm board. The guide pins are coaxial with their corresponding respective guide pin apertures disposed through the probe plate. The guide pins each include a free end which is not connected to the diaphragm board. A vacuum moves the diaphragm board closer to the probe plate to cause the guide pins to protrude through their respective guide pin apertures so that their respective free ends extend below the probe plate when the functional test probes and the in-circuit test probes are in contact with the printed circuit board. This condition represents an in-circuit test condition. Also, the free ends of the guide pins are engageable by a pneumatic cylinder, or the like and secure the diaphragm board relative to the probe plate. When the vacuum is removed, the diaphragm board is secured at a distance from the probe plate whereby only the functional test probes are able to contact the printed circuit board, thus representing a functional test condition.

In operation, the UUT is positioned appropriately on the diaphragm board. Air is removed from the air chamber present between the probe plate and the diaphragm board thus creating a vacuum therebetween. When the diaphragm board moves closer to the probe plate, the guide pins are injected through their respective corresponding guide pin apertures so that their free end are positioned below the probe plate. The application of a full vacuum between the probe plate and the diaphragm board positions the diaphragm board sufficiently close to the probe plate for both the functional test probes and the in-circuit test probes to contact the UUT which is being carried by the diaphragm board. The free ends of the guide pins are engaged by a pneumatically actuated fork member which limits the upper travel of the diaphragm board. Removal of the vacuum between the probe plate and diaphragm board permits the diaphragm board to move upwardly in a restricted fashion so that only the functional test probes are in contact with the printed circuit board. Subsequent application of a full vacuum between the probe plate and the diaphragm board again positions the diaphragm board sufficiently close to the probe plate so that the functional test probes and the in-circuit test probes contact the UUT. The free ends of the guide pins can now be disengaged by the pneumatically actuated fork member to thus allow unrestricted upper travel of the diaphragm board and ultimate removal of the UUT. In-circuit electronic testing is conducted when the diaphragm board is sufficiently close to the probe plate for both the functional test probes and the inserted test probes to be in contact with the printed circuit board. Also, functional electronic testing of the UUT is conducted after the diaphragm board is positioned above the probe plate when only the functional test probes are in contact with the UUT and no vacuum is present.

It is therefore an object of the present invention to provide an automatic bi-level testing equipment test fixture that is inexpensive to produce and maintain by use of standard components and vacuum systems.

Another object of the present invention is to provide an automatic bi-level testing equipment test fixture that can effectively conduct functional and in-circuit testing of a UUT without requiring multiple platens or diaphragm boards.

It is another object of the present invention to provide an automatic bi-level testing equipment test fixture which requires a single level vacuum source for connection to the test fixture.

It is yet a further object of the present invention to provide an automatic bi-level testing equipment test fixture which can conduct a functional test without the presence of a vacuum between the diaphragm board and the probe plate.

It is another object of the present invention to provide an automatic bi-level testing equipment test fixture which maintains contact of the functional test probes to the UUT during transition from in-circuit testing to functional testing and from functional testing to in-circuit testing.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
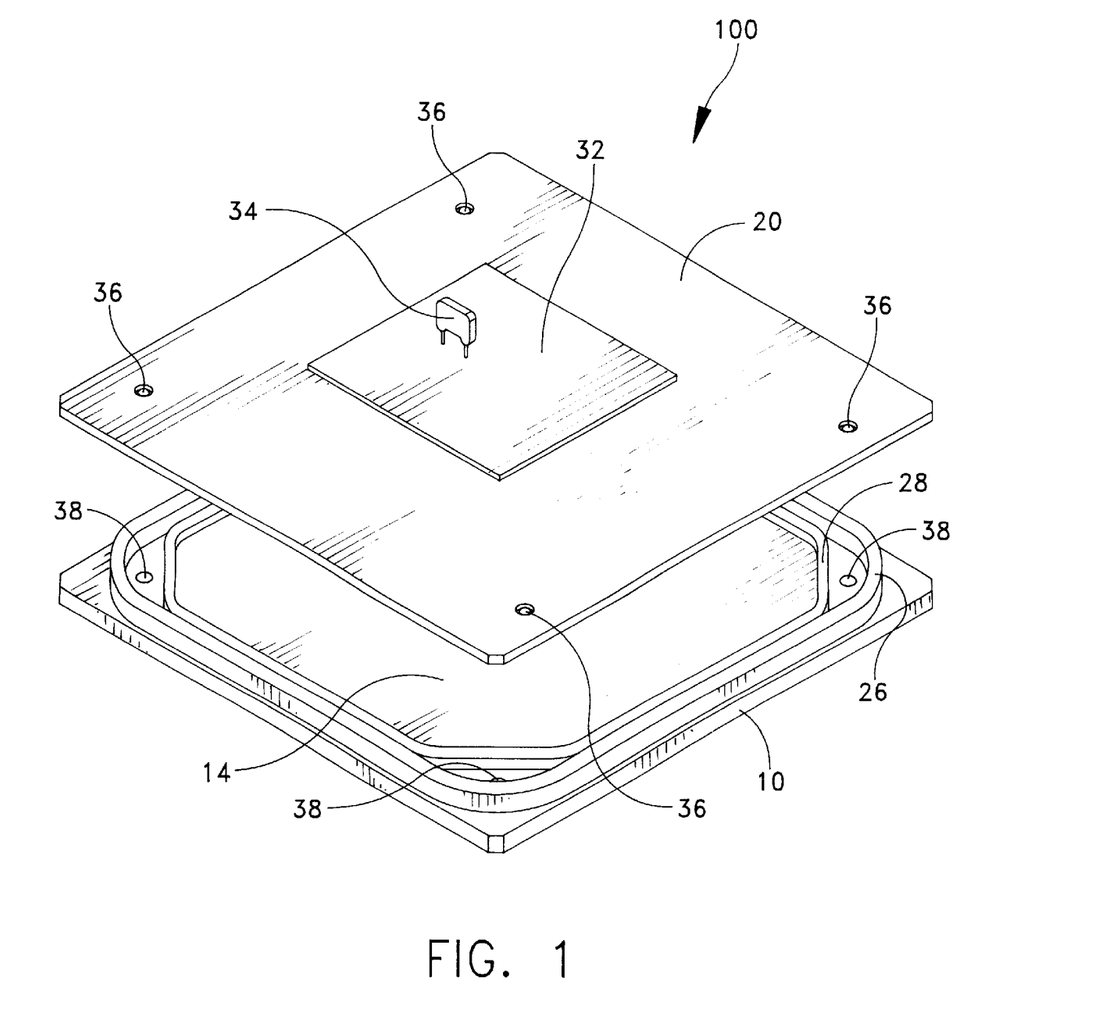
FIG. 1 is a perspective view of the bi-level test fixture for testing printed circuit boards in accordance with the present invention.

Referring to FIG. 1, the bi-level test fixture for testing printed circuit boards of the present invention is generally shown as 100 to include a probe plate 10 and diaphragm board 20. Probe plate 10 includes upper surface 14 and an inner seal 28 and outer seal 26 disposed thereon. Positioned through probe plate 10 are a number of guide pin apertures 38 for receiving respective guide pins 36 which are connected to and emanate downwardly from diaphragm board 20. The engagement of guide pins 36 and guide pin apertures 38 will be discussed in more detail below. In addition, diaphragm board 20 carries electronic circuit device or unit under test (UUT) 32 thereon with seal gasket 33 disposed therebetween. UUT is typically a printed circuit board with various electronic components installed thereon, the installed electronic components being generally referenced, for simplicity, as 34.

UUT 32 sits on diaphragm board 20 and receives probes from below which are installed in and emanate upwardly from probe plate 10. Outer seal 26 and inner seal 28 provide containment for an air chamber developed between diaphragm board 20 and probe plate 10. As vacuum is applied within this air chamber, diaphragm board 20 is drawn closer to probe plate 10 for engagement of the appropriate probes and ultimate testing. Seals 26 and 28 are illustrated as simply one of many different seal configurations which can be employed with the present invention. The double seal of seals 26 and 28 may be replaced with a single seal or other different seal configurations.

Figure 2:
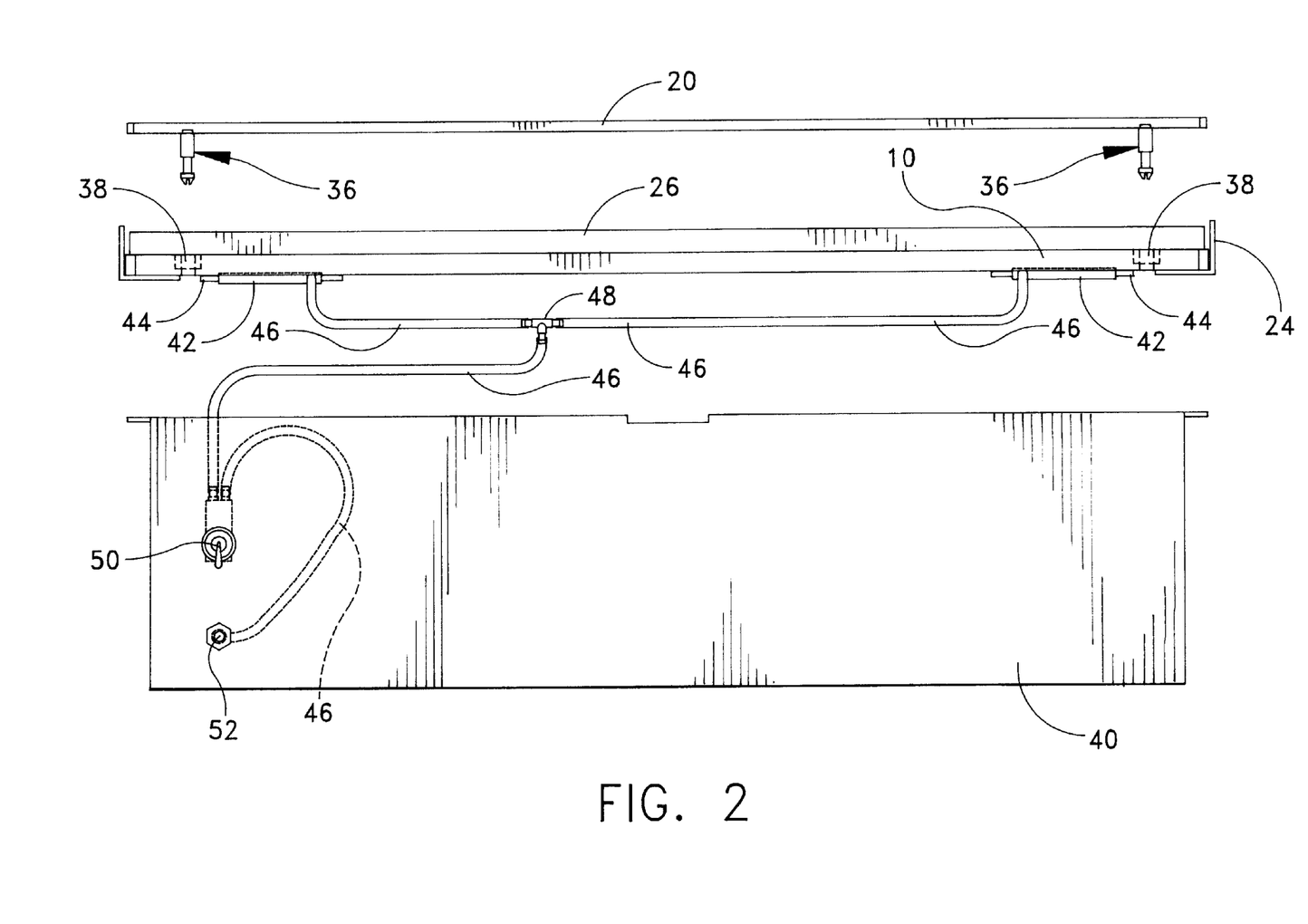
FIG. 2 is an exploded front view of the test fixture of the present invention illustrating the vacuum supply to the test fixture.

Turning now to FIG. 2, an exploded elevational view of the present invention is shown. Diaphragm board 20 includes downwardly emanating guide pins 36 which are aligned with corresponding respective guide pin apertures present through probe plate 10. As can be seen, as diaphragm board 20 travels toward probe plate 10, guide pins 36 are injected into corresponding guide pin apertures 38 and outer seal 26 and inner seal 28 (not shown) provide cushioned spring biasing between diaphragm board 20 and probe plate 10. Additional springs (not shown) may be employed for spring-biasing of the diaphragm board. In addition, support frame or trim ring 24 is provided to serve as containment housing for the probe plate and diaphragm board arrangement.

Positioned on the lower surface of probe plate 10 are a number of pneumatic cylinders 42 for actuating their respective fork members 44 into a region directly below guide pin apertures 38 for engaging guide pins 36. Still further, a housing 40 is provided with inlet port 52 for receiving a standard pneumatic cylinder air supply. Conduits 46 and T-connector 48 are provided for routing the pneumatic cylinder air supply to each of the pneumatic cylinders 42 positioned about the fixture. Switch 50 is provided on housing 40 to selectively engage and disengage pneumatic cylinders 42, as desired.

Figure 3:
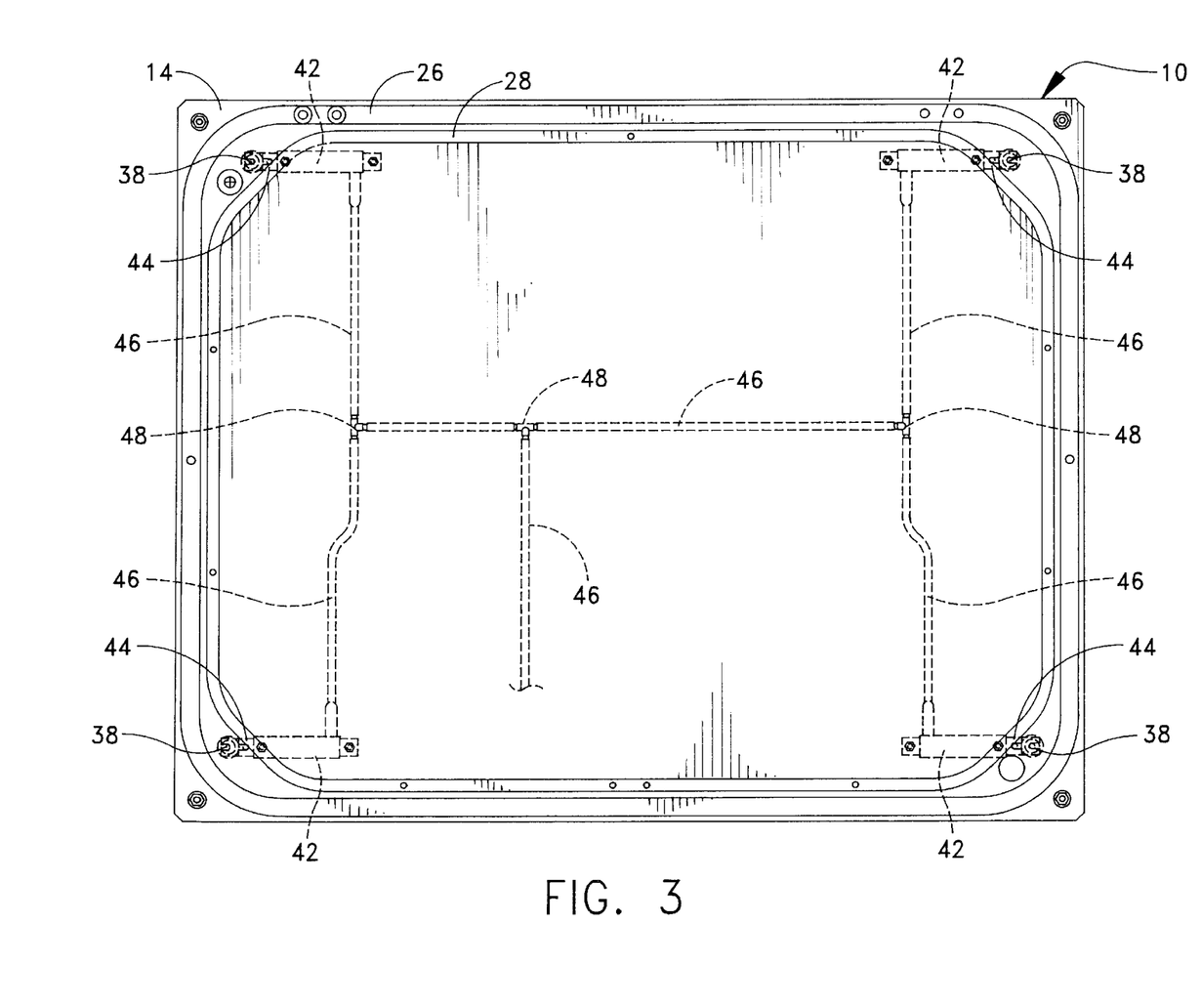
FIG. 3 is a plan view of the test fixture of the present invention illustrating layout of the pneumatic cylinders and vacuum supply conduits.

A plan view of the probe plate of the bi-level test fixture of the present invention is shown in FIG. 3. As can be seen, probe plate 10 has seal members 26 and 28 positioned on upper surface 14. Seal members 26 and 28 are positioned about the periphery of probe plate 10. Conduits 46 and T-connectors 48 supply air for pneumatic air cylinders 42 for actuating fork members 44 in a region substantially below guide pin apertures 38. FIG. 3 illustrates a preferred plan layout for the guide pin apertures 38 and pneumatic cylinders 42 for receipt of guide pins 36. This preferred configuration includes receipt of guide pins 36 (not shown in FIG. 3) through guide pin apertures 38 at each of the four corners of the test fixture. It should be understood that it is possible to include fewer or more guide pin apertures 38 and pneumatic cylinders 42 to accommodate the particular application and test fixture at hand. Further, the routing of conduits 46 and T-connectors 48 may be altered depending on the application and UUT to be tested.

Turning now to FIGS. 4–9, the operational cycle of the bi-level test fixture 100 of the present invention is shown. For simplicity and ease of illustration, the operation of the bi-level test fixture of the present invention will be discussed in connection with the use of a single guide pin 36 and corresponding pneumatic cylinder 42 and fork member 44. It should be understood that remaining guide pin and pneumatic cylinder arrangements, within test fixture 100, operate in identical fashion as to what will be described in detail below.

Figure 4:
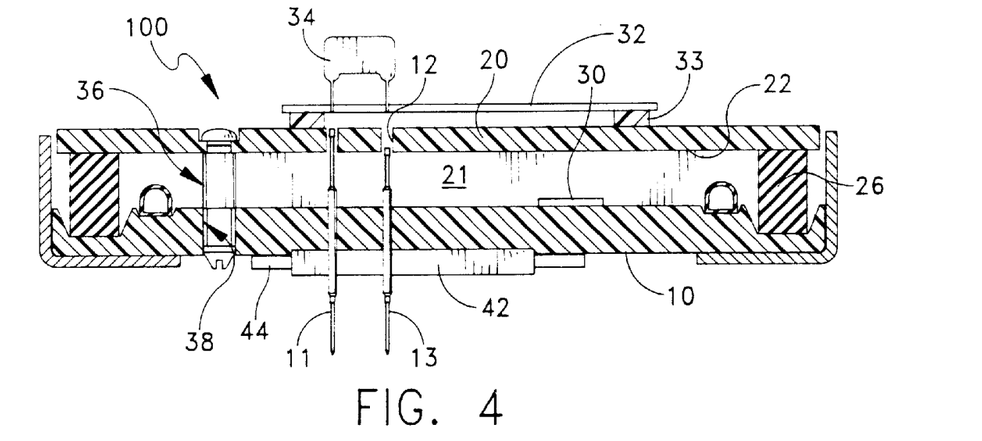
FIG. 4 is a partial cross-sectional view of the invention of FIG. 1 in a resting condition.

Turning first to FIG. 4, a cross-sectional view of the test fixture 100 of the present invention is shown. FIG. 4 illustrates test fixture 100 at rest with no vacuum applied within air chamber 21 disposed between diaphragm board 20 and probe plate 10. Disposed on the upper surface of diaphragm board 20 is gasket 33 for carrying UUT 32 with a representative electronic component 34 installed thereon. Guide pin 36 is fastened to and emanates downwardly from lower surface 22 of diaphragm board 20 so as to extend into guide pin aperture 38 through probe plate 10.

Since vacuum has not been introduced within air chamber 21 and test fixture is at rest, resilient seal member 26 supports diaphragm board 20. UUT 32 rests above functional test probe 11 and in-circuit test probe 13 thus indicating a complete rest and non-test condition. It should be understood that functional test probe 11 is representative of many similar functional test probes which emanate upwardly from probe plate 10 and through a probe aperture 12 and diaphragm board 20. Similarly, in-circuit test probe 13 represents many other in-circuit test probes positioned across probe plate 10 which also extend through probe apertures 12 and diaphragm board 20. For simplicity and ease of illustration, a single functional test probe 11 and a single in-circuit test probe 13 are shown to represent their corresponding class of probes. In particular, functional test probes, collectively referred to as 11, extend higher than the in-circuit test probes 13 so as to enable bi-level testing by securing probe plate 20 at different levels so that either one or both of the functional test probes 11 or in-circuit test probes 13 are in contact with UUT 32 for carrying out the desired test.

Figure 5:
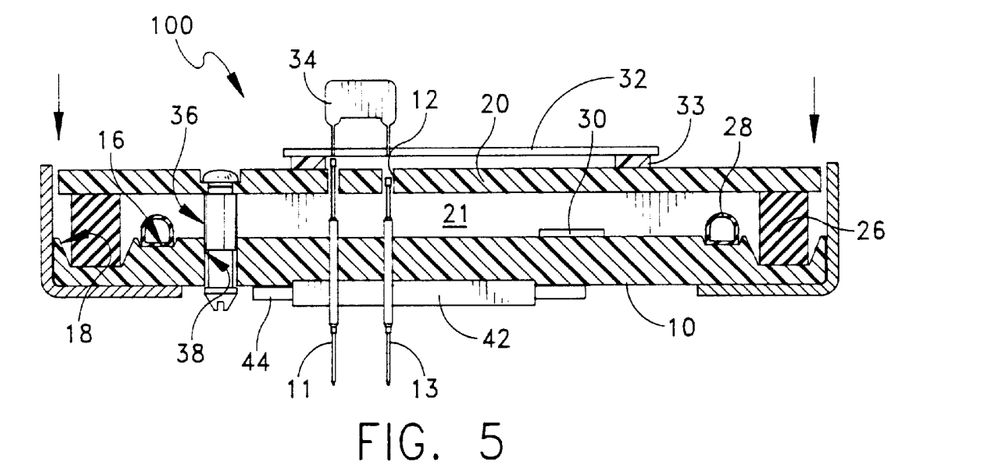
FIG. 5 is a partial cross-sectional view of the invention of FIG. 1 illustrating the initiation of removal of air between the diaphragm board and the probe plate.
Figure 6:
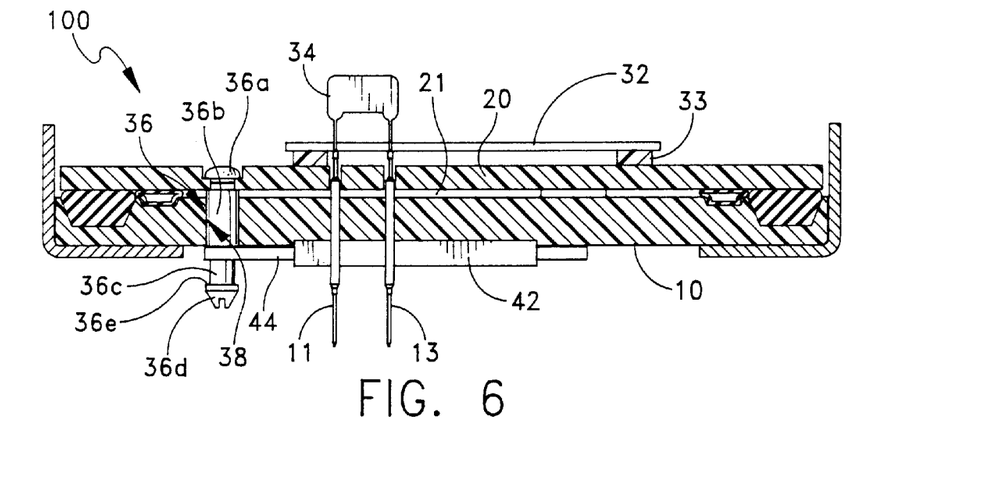
FIG. 6 is a partial cross-sectional view of the invention of FIG. 1 illustrating full vacuum applied to the fixture and pneumatic cylinders engaged with the guide pins.

Referring now to FIG. 5, vacuum within air chamber 21 is starting to be applied and, as represented by the arrows, diaphragm board 20 moves toward probe plate 10 with guide pin 36 extending further through guide pin aperture 38. As diaphragm board 20 travels downwardly, functional test probe 11 contacts UUT 32 because it is positioned higher than in-circuit test probe 13. As shown in FIG. 6, evacuation of air in chamber 21 is complete and a full vacuum is applied to fixture 100. Stop 30 provides a limit for the downward travel of diaphragm board 20 toward probe plate 10. In this full vacuum condition, as shown in FIG. 6, both functional test probe 11 and in-circuit test probe 13 are in contact with UUT 32 and are, therefore, capable of conducting a full in-circuit test of UUT 30 during this full vacuum condition.

Still referring to FIG. 6, while a full vacuum is maintained in the fixture, fork member 44 is actuated from pneumatic cylinder 42 by engaging switch 50 as shown in FIG. 2 to force fork member 44 about neck portion 36c of guide pin 36 which is now exposed below probe plate 10. As will be discussed in detail below, guide pin 36 includes fastening head 36a, shaft 36b, reduced neck portion 36c, head region 36d and bearing surface 36e.

After in-circuit testing of the UUT 32 is completed under full vacuum and after fork member 44 is engaged with guide pin 36, vacuum within air chamber 21 is released and, due to the spring biasing of seal member 26, diaphragm board 20 naturally is drawn in an upward direction now vertically limited by engagement of fork member 44 with head 36d of guide pin 36 at bearing surface 36e. As a result of the outward actuation of fork member 44 in engagement with guide pin 36, diaphragm board 20 is restricted from upwardly traveling to its resting position in FIG. 4 and will reach a maximum upward position with only functional test probe 11 in contact with UUT 32. With guide pin 36 engaged by fork member 44 and no vacuum present within air chamber 21, a functional test of UUT 32 can be conducted without the presence of a vacuum applied to the test fixture 100 and without previously disengaging functional test probe 11 from when the previous in-circuit test was conducted. As a result, electrical contact integrity of the functional test probe 11 can be maintained even though different test modes are being carried out by the test fixture.

Figure 7:
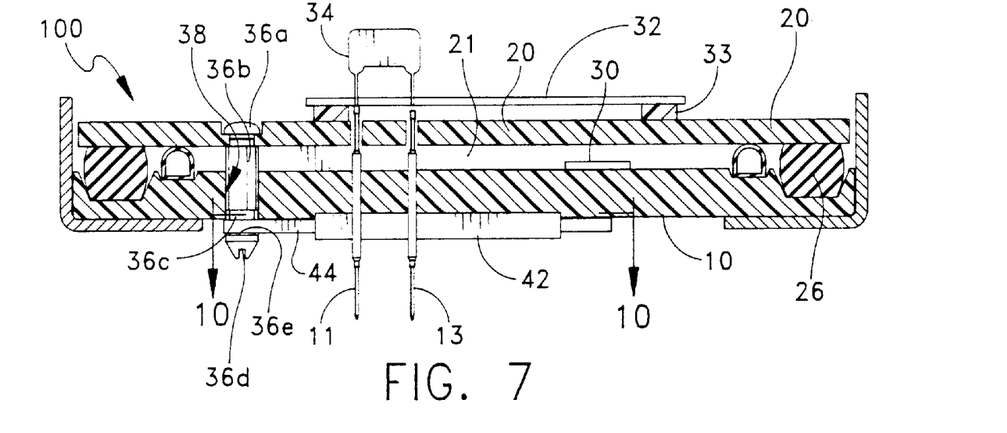
FIG. 7 is a cross-sectional view of the invention of FIG. 1 illustrating a functional test condition with vacuum released and guide pins engaged by pneumatic cylinders.
Figure 8:
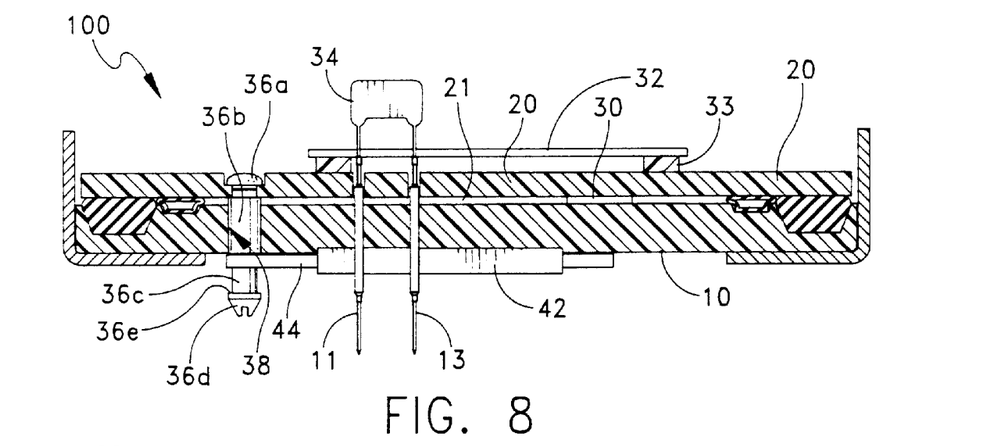
FIG. 8 is a cross-sectional view of the invention of FIG. 1 illustrating full vacuum applied to the fixture permitting disengagement of the pneumatic cylinders from the guide pins.
Figure 9:
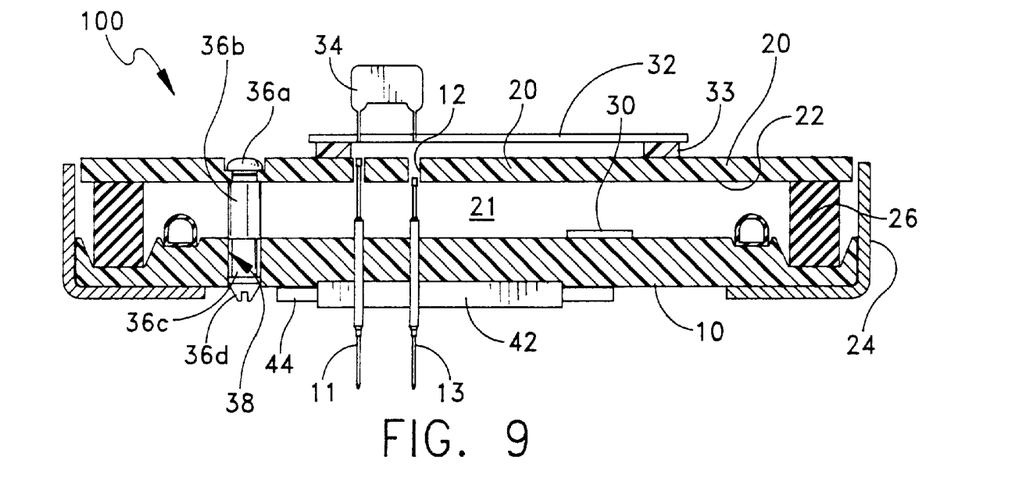
FIG. 9 is a cross-sectional view of the invention of FIG. 1 with pneumatic cylinders completely disengaged and vacuum released to permit removal of the UUT.

After functional testing, as shown in FIG. 7, is completed, the guide pin 36 must now be disengaged from fork member 44 so that diaphragm board 20 may return to its original resting position as shown in FIG. 4 to permit removal of UUT 32. In FIG. 8, a full vacuum is again applied and diaphragm board 20 is drawn completely to diaphragm board 10 as bounded by stop 30. As a result, fork member 44 lifts off of bearing surface 36e on head 36d of guide pin 36. As shown in FIG. 9, fork member 44 is retracted by disengagement of air supply via switch 50 shown in FIG. 2. With fork member 34 retracted and disengaged from guide pin 36, vacuum to the fixture is completely released permitting diaphragm board 20 to return to its original resting position to allow for removal of the completely tested UUT 30 and for receipt of an untested UUT for repeat of the entire cycle of operation.

As discussed above, a complete vacuum is applied to the test fixture two separate times. First, a full vacuum is applied to permit engagement of guide pin 36 and then a second time for disengagement of guide pin 36. As a result, in-circuit testing can be conducted at either one or both of the times when a full vacuum is applied to the test fixture. The present invention allows for two opportunities to conduct an in-circuit test which can be employed to confirm in-circuit testing results.

Figure 10:
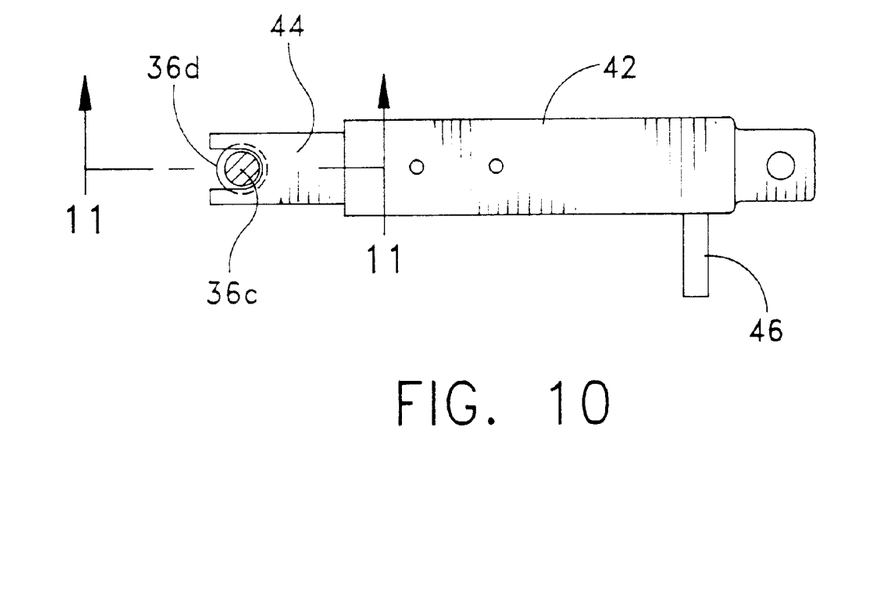
FIG. 10 is a plan view of an engagement of a guide pin by a corresponding pneumatic cylinder.
Figure 11:
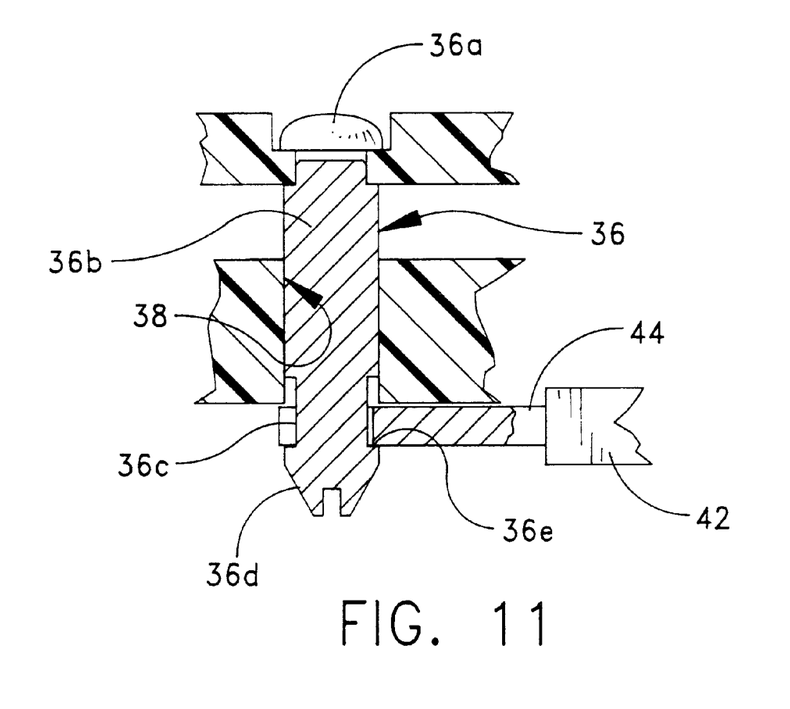
FIG. 11 is a cross-sectional view through the line 11—11 of FIG. 10.

Turning now to FIG. 10, details of the engagement of fork member 44 with guide pin 36 is shown. Pneumatic cylinder 42 receives an air supply via air conduit 46. Fork member 44 is actuatable between a retracted and extended position. FIG. 10 illustrates an extended position by actuation of pneumatic cylinder 42 so that fork member 44 embraces reduced neck portion 36c of guide pin 36. Further engagement of fork member 44 with guide pin 36 is shown in FIG. 11, which is a cross-sectional view through line 11—11 of FIG. 10. Guide pin 36 generally includes a fastening head 36a, a main shaft portion 36b, reduced neck portion 36c, head portion 36d and bearing surface 36e. Guide pin 36 is preferably made of metal material but can be made of other material to suit the application at hand. In addition, guide pin 36 is fastened via connector 36a which may be a rivet, male threaded screw, or the like to securely position guide pin 36 in a downward direction through guide pin aperture 38.

Various other configurations may be employed to limit the upward travel of diaphragm board 20 after vacuum within chamber 21 has been released. The guide pin 36 and pneumatic cylinder 42 arrangement is a preferred embodiment and other configurations may be employed. For example, fork member 44 may be manually actuated by use of a gearing configuration as opposed to air power by pneumatic cylinder 42. Still further, guide pin 36 may include other configurations such as an aperture therethrough for receiving an actuatable rod to restrict upward travel of diaphragm board 20.

As a result of the present invention, both functional and in-circuit testing can be carried out without requiring expensive multi-level vacuum controllers and equipment. Further, transition from in-circuit testing to functional testing and the transition from functional testing to in-circuit testing does not require disengagement of the functional test probes from the UUT resulting in higher contact integrity and improved testing results and accuracy. As a result, standard single-level vacuum sources can be employed with the present invention which are much less expensive than multi-level vacuum controllers. Further, costly multi-level vacuum controllers suffer from plumbing problems in addition to the added expense and require significant modification of the testing station to accommodate such vacuum controllers. Further, large springs are required on the test fixture to accommodate the larger vacuums supplied by the multi-level vacuum system thus sacrificing valuable surface area on the probe plate.

It would be appreciated by those skilled in the art that various changes and modifications can be made to the illustrated embodiments without departing from the spirit of the present invention. All such modifications and changes are intended to be covered by the appended claims.

What is claimed is:

1. A bi-level automatic testing equipment test fixture for a printed circuit board, comprising:

a probe plate, having an upper surface, defining at least one functional test probe aperture and at least one in-circuit test probe aperture therein; said probe plate further defining at least one guide pin aperture therethrough;

at least one functional test probe residing in said at least one functional test probe aperture and extending upwardly from said upper surface of said probe plate a first distance and at least one in-circuit test probe residing in said at least one in-circuit test probe aperture and extending upwardly from said upper surface of said probe plate a second distance; said first distance being greater than said second distance;

a diaphragm board, having a lower surface, positioned above said probe plate defining an air chamber therebetween;

seal means positioned between said probe plate and said diaphragm board for maintaining a vacuum between said probe plate and said diaphragm board upon removal of air present in said air chamber; said diaphragm board being movable relative to said probe plate;

at least one guide pin connected to and emanating downwardly from said diaphragm board; said at least one guide pin being co-axial with said at least one guide pin aperture; said at least one guide pin including a free end not connected to said diaphragm board;

vacuum means for moving said diaphragm board proximal to said probe plate and causing said at least one guide pin to protrude through said at least one guide pin aperture with said free end residing below said probe plate with both said at least one functional test probe and said at least one in-circuit test probe being in contact with a printed circuit board residing on said diaphragm board representing an in-circuit test condition;

means for engaging said free end of said at least one guide pin and securing said diaphragm board relative to said probe plate; with said vacuum means removed, said diaphragm board being secured at a distance from said probe plate whereby only said at least one functional test probe is in contact with said printed circuit board representing a functional test condition.

2. The test fixture of claim 1, wherein said seal means is elastomeric rubber.

3. The test fixture of claim 1, wherein said at least one guide pin includes a reduced neck and head portion.

4. The test fixture of claim 3, wherein said means for engaging said free end of said at least one guide pin is a pneumatically actuated fork member engageable with said reduced neck and said head portion of said at least one guide pin.

5. A method for conducting automatic functional and in-circuit testing of a printed circuit board, comprising the steps of:

providing a probe plate, having an upper surface, defining a plurality of functional test probe apertures and a plurality of in-circuit test probe apertures therein; said probe plate further defining a plurality of guide pin apertures therethrough;

providing a plurality of functional test probes respectively residing in said plurality of functional test probe apertures and extending upwardly from said upper surface of said probe plate;

providing a plurality of in-circuit test probes respectively residing in said plurality of in-circuit test probe apertures and extending upwardly from said upper surface of said probe plate; said plurality of functional test probes extending a greater distance above said probe plate than said plurality of in-circuit test probes;

providing a diaphragm board, having a lower surface, positioned above said probe plate defining an air chamber therebetween;

providing a seal positioned between said probe plate and said diaphragm board for making said air chamber substantially air-tight;

providing a plurality of guide pins connected to and emanating downwardingly from said diaphragm board; said plurality of guide pins corresponding to and being co-axial with a corresponding one of said plurality of guide pin apertures; each of said plurality of guide pins include a free end not connected to said diaphragm board;

removing air from said air chamber between said probe plate and said diaphragm board creating a vacuum therebetween;

moving said diaphragm board proximal said probe plate;

injecting said plurality of guide pins through respective corresponding guide pin apertures with free ends of said plurality of guide pins being positioned below said probe plate;

applying a full vacuum between said probe plate and said diaphragm board;

positioning said diaphragm board sufficiently close to said probe plate for said plurality of said functional test probes and said plurality of in-circuit test probes to contact a printed circuit board being carried by said diaphragm board;

engaging said free ends of said plurality of guide pins limiting upward travel of said diaphragm board;

removing said vacuum between said probe plate and said diaphragm board;

positioning said diaphragm board above said probe plate with only said plurality of functional test probes being in contact with said printed circuit board;

applying a full vacuum between said probe plate and said diaphragm board;

positioning said diaphragm board sufficiently close to said probe plate for said plurality of said functional test probes and said plurality of in-circuit test probes to contact said printed circuit board being carried by said diaphragm board;

disengaging said free ends of said plurality of guide pins allowing unrestricted upward travel of said diaphragm board; and removing said vacuum between said probe plate and said diaphragm board.

6. The method of claim 5, further comprising the step of:

conducting an in-circuit electronic test of said printed circuit board after positioning said diaphragm board sufficiently close to said probe plate for said plurality of said functional test probes and said plurality of in-circuit test probes to contact said printed circuit board.

7. The method of claim 5, further comprising the step of:

conducting a functional electronic test of said printed circuit board after positioning said diaphragm board above said probe plate with only said plurality of functional test probes being in contact with said printed circuit board.

8. The method of claim 5, further comprising the step of:

providing a plurality of pneumatic cylinders with fork members on each respective actuatable ends to engage respective corresponding said free ends of said plurality of guide pins.

9. The method of claim 8, further comprising the step of:

providing a reduced neck on each of said plurality of guide pins for engagement of said plurality of said guide pins with corresponding respective fork members.

10. A bi-level automatic testing equipment test fixture for a printed circuit board, comprising:

a probe plate;

a plurality of functional test probes emanating upwardly from said probe plate a first distance;

a plurality of in-circuit test probes emanating upwardly from said probe plate a second distance; said second distance being shorter than said first distance;

a diaphragm board moveable between a rest position, with a printed circuit board, installed on said diaphragm board, being separated from said plurality of functional test probes and said plurality of in-circuit test probes; a full vacuum position with said printed circuit board being in contact with said plurality of functional test probes and said plurality of in-circuit test probes upon removal of air present between said probe plate and said diaphragm board; and a locked position with said printed circuit board being in contact with said plurality of functional test probes only;

a first lock means connected to said diaphragm board;

a second lock means connected to said probe plate; said second lock means being enagageable and securable to said first lock means;

whereby when said diaphragm board is located in its full vacuum position, with said first lock means and said second lock means engaged and secured to one another, said diaphragm board is moveable between said full vacuum position for in-circuit electronic testing of said printed circuit board upon removal of air present between said probe plate and said diaphragm board and said locked position for functional electronic testing of said printed circuit board when air is present between said probe plate and said diaphragm board.

* * * * *